(12) United States Patent
Preuschl et al.

(10) Patent No.: US 9,851,058 B2
(45) Date of Patent: Dec. 26, 2017

(54) LIGHTING MODULE

(71) Applicant: OSRAM GmbH, Munich (DE)

(72) Inventors: Thomas Preuschl, Sinzing (DE);
Guenter Hoetzl, Regensburg (DE);
Peter Sachsenweger, Zeitlarn (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 14/413,419

(22) PCT Filed: Jun. 28, 2013

(86) PCT No.: PCT/EP2013/063745
§ 371 (c)(1),
(2) Date: Jan. 8, 2015

(87) PCT Pub. No.: WO2014/009181
PCT Pub. Date: Jan. 16, 2014

(65) Prior Publication Data
US 2015/0159816 A1    Jun. 11, 2015

(30) Foreign Application Priority Data

Jul. 10, 2012   (DE) .................. 10 2012 212 025

(51) Int. Cl.
*F21K 99/00* (2016.01)
*F21V 19/00* (2006.01)
(Continued)

(52) U.S. Cl.
CPC .................. *F21K 9/30* (2013.01); *F21K 9/20* (2016.08); *F21V 19/003* (2013.01);
(Continued)

(58) Field of Classification Search
CPC ........ B60Q 3/044; B60Q 3/048; B60Q 3/004; B60K 2350/203; G01D 11/28;
(Continued)

(56) References Cited

U.S. PATENT DOCUMENTS 6,502,968 B1    1/2003  Simon
6,530,279 B1 *  3/2003  Weinmann, Jr. ...... G01M 7/027
                                                          73/663
(Continued)

FOREIGN PATENT DOCUMENTS

CN    101144919 A    3/2008
CN    101625480 A    1/2010
(Continued)

OTHER PUBLICATIONS

Chinese Office Action based on Application No. 201380037192.7 (9 Pages and 6 Pages of English translation) dated Nov. 12, 2015 (Reference Purpose Only).
(Continued)

*Primary Examiner* — Alan Cariaso
*Assistant Examiner* — Mark Tsidulko
(74) *Attorney, Agent, or Firm* — Viering, Jentschura & Partner mbB (57) ABSTRACT

Various embodiments may relate to a lighting module, including a first printed circuit board, on which at least one light source is arranged, a covering element, which at least partially covers the first printed circuit board, and a second printed circuit board, on which at least one electronic component is arranged, wherein the second printed circuit board is fastened to the covering element and is electrically connected to the first printed circuit board.

13 Claims, 4 Drawing Sheets

(51) Int. Cl.
*F21V 23/00* (2015.01)
*H05K 1/14* (2006.01)
*F21K 9/20* (2016.01)
*H05K 1/11* (2006.01)
*H05K 1/18* (2006.01)
*H05K 3/00* (2006.01)
*H05K 3/36* (2006.01)
*F21K 9/90* (2016.01)
*F21Y 105/10* (2016.01)
*F21Y 115/10* (2016.01)

(52) U.S. Cl.
CPC .......... *F21V 23/006* (2013.01); *H05K 1/147* (2013.01); *F21K 9/90* (2013.01); *F21Y 2105/10* (2016.08); *F21Y 2115/10* (2016.08); *H05K 1/118* (2013.01); *H05K 1/189* (2013.01); *H05K 3/0058* (2013.01); *H05K 3/0061* (2013.01); *H05K 3/363* (2013.01); *H05K 2201/042* (2013.01); *H05K 2201/055* (2013.01); *H05K 2201/0999* (2013.01); *H05K 2201/10015* (2013.01); *H05K 2201/10106* (2013.01); *Y10T 29/49126* (2015.01)

(58) Field of Classification Search
CPC .......... G06F 3/0202; H01H 2219/062; H01H 2219/056; H01H 13/83; H01H 13/702
USPC .......................................... 362/249.02, 23.03
See application file for complete search history.

(56) References Cited

U.S. PATENT DOCUMENTS

| | | | | |
|---|---|---|---|---|
| 7,686,465 | B2* | 3/2010 | Okayasu | G06F 3/0202 362/23.03 |
| 8,335,470 | B2* | 12/2012 | Koyama | H01Q 1/243 235/492 |
| 8,743,560 | B2* | 6/2014 | Kim | H05K 1/0231 174/255 |
| 2008/0068313 | A1 | 3/2008 | Jang | |
| 2008/0123341 | A1 | 5/2008 | Chiu | |
| 2009/0052126 | A1* | 2/2009 | Komiyama | G06F 1/1624 361/679.56 |
| 2010/0007814 | A1 | 1/2010 | Kim | |
| 2010/0273539 | A1* | 10/2010 | Lee | H04M 1/0277 455/575.3 |
| 2011/0104230 | A1* | 5/2011 | Mousa | A61L 27/10 424/423 |
| 2011/0211346 | A1 | 9/2011 | Ogawa et al. | |
| 2012/0051068 | A1 | 3/2012 | Pelton et al. | |
| 2012/0140442 | A1 | 6/2012 | Woo et al. | |
| 2012/0141462 | A1* | 6/2012 | Messmer | G01N 33/6878 424/131.1 |
| 2012/0236563 | A1 | 9/2012 | Breidenassel et al. | |

FOREIGN PATENT DOCUMENTS

| | | |
|---|---|---|
| CN | 102168816 A | 8/2011 |
| CN | 102384438 A | 3/2012 |
| CN | 102466161 A | 5/2012 |
| CN | 102537723 A | 7/2012 |
| DE | 102009047493 A1 | 6/2011 |
| DE | 202011107787 U1 | 3/2012 |
| DE | 102010043140 A1 | 5/2012 |
| EP | 2455655 A2 | 5/2012 |
| JP | 2011192403 A | 9/2011 |
| JP | 2012074250 A | 4/2012 |
| TW | M1310984 U | 5/2007 |
| WO | 2012055852 A1 | 5/2012 |

OTHER PUBLICATIONS

International Search Report dated Aug. 29, 2013 in the corresponding International Patent Application No. PCT/EP2013/063745.
Office Action dated Apr. 12, 2013 in the corresponding German Patent Application No. DE 10 2012 212 025.4.

* cited by examiner

LIGHTING MODULE

RELATED APPLICATIONS

The present application is a national stage entry according to 35 U.S.C. §371 of PCT application No.: PCT/EP2013/063745 filed on Jun. 28, 2013, which claims priority from German application No.: 10 2012 212 025.4 filed on Jul. 10, 2012, and is incorporated herein by reference in its entirety.

TECHNICAL FIELD

Various embodiments relate to a lighting module.

BACKGROUND

Such lighting modules usually include a printed circuit board with one or more light sources arranged on the upper side thereof and a covering element, which at least partially covers the printed circuit board. In addition, provision is generally made for the lighting modules to have an external driver or control gear, in which one or more electronic components which are required for operating the light sources on the printed circuit board are arranged. Said one or more electronic components are connected to the printed circuit board having one or more light sources. By virtue of such an external driver or such external control gear, a large amount of installation space is required for the lighting module, in particular in a lighting device.

SUMMARY

Various embodiments provide a lighting module and a method for mounting a lighting module in which a more compact configuration of the lighting module can be achieved.

In various embodiments, a lighting module may have: a first printed circuit board, on which at least one light source is arranged, a covering element, which at least partially covers the first printed circuit board, and a second printed circuit board, on which at least one electronic component is arranged, wherein the second printed circuit board is fastened to the covering element and is electrically connected to the first printed circuit board.

Such a lighting module has the advantage that the second printed circuit board, which is otherwise generally arranged in an additional driver or additional control gear and which is populated with one or more electronic components, is now arranged directly in the covering element which covers the first printed circuit board populated with the light source by virtue of the second printed circuit being fastened on an inner surface, in particular on an inner surface of a top wall, of the covering element and is therefore arranged parallel to the first printed circuit board, in particular above the first printed circuit board. The second printed circuit board is arranged so as to be spaced apart from the inner surface of the top wall of the covering element in the region of the one or more electronic components, with the result that the one or more electronic components arranged on the second printed circuit board can be positioned between the second printed circuit board and the inner surface of the top wall of the covering element. It is thereby possible in the case of an arrangement of electronic component parts on the first printed circuit board for the second printed circuit board to act as a type of insulating layer between the electronic component parts arranged on the first printed circuit board and the electronic components arranged on the second printed circuit board since the second circuit board is arranged between the electronic component parts and the electronic components. In the case of such a design, it is further advantageous that the covering element can be formed from a standard material, in particular a standard plastic, since the second printed circuit board populated with the electronic components is provided as additional component part with respect to the covering element and is merely inserted into the covering element. Therefore, no particular requirements need to be made of the material for the covering element. In addition, by virtue of this design, the electronic component(s) arranged on the second printed circuit board can be arranged in the lighting module in a particularly space-saving manner, as a result of which the entire lighting module can have a more compact design and thus less installation space is required than is required for the conventional lighting modules in the case of installation in a lighting device, as a result of which a greater degree of design freedom for the lighting device can also be achieved. In addition, the entire mounting of the lighting module can be considerably simplified hereby for a user since the user only needs to connect the mains voltage in order to bring the lighting module into operation. One or more electronic components can be arranged on the second printed circuit board, wherein in the case of a plurality of electronic components having the same function, electronic components with different powers can be combined with one another, as a result of which the properties of the lighting module can be set and adapted individually.

The second printed circuit board may be a flexible printed circuit board, for example. A flexible printed circuit board is characterized by the fact that it is bendable or foldable, with the result that its shape can be matched individually to the installation conditions within the covering element. In particular, the second printed circuit board can thus be bent in such a way that, as far as possible, a simple, short connection between the second printed circuit board and the first printed circuit board is possible. In addition, owing to the bendability of the printed circuit board, said printed circuit board can have a larger area than the diameter of the covering element in the basic position of said printed circuit board, before it is bent to the size matching the covering element, with the result that an air-gap and leakage-path extension between the electronic components arranged on the second printed circuit board and the first printed circuit board can be formed by the second printed circuit board. In comparison with conventional printed circuit boards, a flexible printed circuit board is also characterized by a lower weight, as a result of which the total weight of the lighting module can be reduced in comparison with conventional lighting modules. For example, the flexible printed circuit board can be formed from a polyimide.

The second printed circuit board is electrically connected to the first printed circuit board by a welded connection or a soldered connection, for example. A secure, stable connection with at the same time good conductivity can be formed between the two printed circuit boards by a welded connection or soldered connection. In addition, a welded or soldered connection for connecting the two printed circuit boards to one another is characterized by less susceptibility to faults than is the case for other types of connection. However, it is also possible to electrically connect the two printed boards to one another in another way, for example a spring contact and/or clamping contact.

In order to simplify the formation of the electrical connection between the second printed circuit board and the first printed circuit board, the second printed circuit board can have a first connection lug. The first connection lug can be formed on an outer circumferential surface of a basic body of the second printed circuit board, on which the electronic components are arranged, wherein the connection lug is bent correspondingly, preferably bent in the form of an L, in order to be able to rest at least partially on the first printed circuit board and therefore to be able to form a direct contact between the two printed circuit boards, for example by a welded or soldered connection. If the second printed circuit board is a flexible printed circuit board, the first connection lug can be bent correspondingly during mounting of the lighting module in order to achieve an individually matched connection to the first printed circuit board.

In addition, it is possible for the second printed circuit board to have a second connection lug, on which a mains connection is arranged. This second connection lug can likewise be formed on the outer circumferential surface of the basic body of the second printed circuit board, on which the electronic components are arranged, wherein the second connection lug is opposite the first connection lug on the basic body, for example. The mains connection in the form of a module connector, for example, can be integrated in the lighting module via the second connection lug, wherein, by virtue of the arrangement of the mains connection on the second connection lug, which is formed in addition to the basic body, the space available on the printed circuit board for the electronic components is not reduced by the additional arrangement of the mains connection. The second connection lug is formed so as to be bent back with respect to the basic body of the printed circuit board, for example, wherein the second connection lug is formed so as to bend back in an opposite direction with respect to the first connection lug from the basic body, for example. In particular, the second connection lug, in contrast to the first connection lug, can be bent away from the first printed circuit board. If the second printed circuit board is a flexible printed circuit board, the second connection lug can be bent correspondingly during mounting of the lighting module.

The at least one electronic component arranged on the second printed circuit board may be a surface-mounted component (SMD=Surface-Mounted Device), for example. As surface-mounted component, the electronic component has a solderable connection area, by which the electronic component can be soldered directly to the printed circuit board. As a result, in the case of a plurality of electronic components, particularly dense population on the printed circuit board is possible, as a result of which the space requirement for the electronic components can be reduced and therefore the entire lighting module can be made more compact. In addition, the population of the printed circuit board with electronic components can be performed particularly quickly, as a result of which the mounting time of the entire lighting module can be reduced.

The fastening of the second printed circuit board on the covering element can take place by a welded connection, an adhesive connection and/or a latch-in connection, as a result of which secure and stable fastening can be formed between the second printed circuit board and the covering element. The welded connection can be formed in particular by plastic laser welding.

The electronic component is a capacitor, for example, which is used in particular to smooth supply voltages of the light source, to filter out electromagnetic interference and to reduce the development of noise. In the case of the arrangement of a plurality of capacitors as electronic components in the covering element, the modulation behavior, i.e. so-called flicker, of the light source can be adjusted, in particular reduced, by a targeted selection of the number of capacitors. The electronic component can also have another function in addition to the configuration as capacitor, however, for example by virtue of said electronic component being in the form of a resistor.

If the electronic component is a capacitor, the capacitor is formed from a ceramic material, for example. In the case of the formation of the capacitor from a ceramic material, said capacitor can have a smaller physical shape in comparison with a conventional electrolyte capacitor, as a result of which the capacitor requires less installation space and, as a result, the dimensions of the entire lighting module can be further reduced. However, it is also possible to use an electrolytic capacitor as capacitor, wherein, owing to the arrangement of the electrolytic capacitor in the covering element, the spacing with respect to the heat source can be increased in comparison with the arrangement in an external driver, as a result of which the life of the electrolytic capacitor can be increased in comparison with the arrangement in a conventional lighting module.

In order to prevent the covering element from being able to detach in an undesired manner from the first printed circuit board and, as a result, protection against electric shock no longer being provided by the covering element, the covering element can be connected detachably or undetachably to the printed circuit board. By virtue of the detachable or undetachable connection, the covering element is connected fixedly to the first printed circuit board by a form-fitting connection and/or a force-fitting connection and/or a cohesive connection, wherein the connection can be formed by a clamping connection, an adhesive connection or a hot-caulking connection.

The light source can be, for example, a light-emitting diode (LED), wherein the light-emitting diode can also be an organic light-emitting diode (OLED). If more than one light source and therefore more than one light-emitting diode are arranged in the lighting module, said light-emitting diodes can be selected such that they emit light in the same color or in different colors.

A method for mounting a lighting module can be performed, for example, in such a way that at least one light source is arranged on a first printed circuit board, at least one electronic component is arranged on a second printed circuit board, the second printed circuit board, which is populated with the at least one electronic component, is fastened on a covering element, the second printed circuit board is electrically connected to the first printed circuit board, and the covering element is positioned on the first printed circuit board in such a way that the covering element at least partially covers the first printed circuit board.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the attached drawings, which form part of said description and in which a specific embodiment is shown, for illustrative purposes, in which the disclosure can be implemented. In this respect, directional terminology such as, for example, "at the top", "at the bottom", "at the front", "at the rear", "front", "rear", etc. is used with respect to the orientation of the figure(s) described. Since components of embodiments can be positioned in a number of different orientations, the directional terminology is used for illustrative purposes and is in no way restrictive. It goes without saying that other embodiments can also be used and structural or logical amendments can be made without departing from the scope of protection of the present disclosure. The detailed description below should not be interpreted in a restrictive sense, and the scope of protection of the present disclosure is defined by the attached claims.

Within the scope of this description, the terms "connected" and "coupled" are used to describe both a direct and an indirect connection, and direct or indirect coupling. In the figures, identical or similar elements have been provided with identical reference symbols, in so far as this is expedient.

Figure 1:
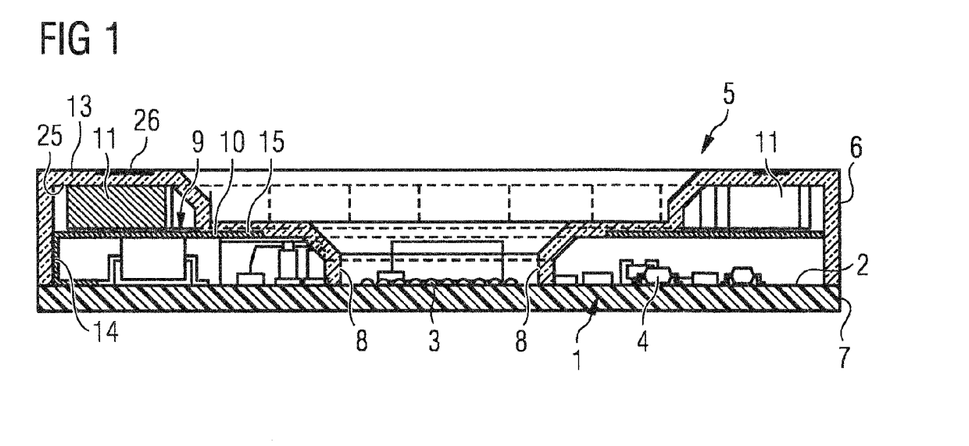
FIG. 1 shows a schematic sectional illustration of a lighting module.

FIG. 1 shows a lighting module, which has a first printed circuit board 1 which is substantially in the form of a circular disc and which is populated on its upper side 2 with a plurality of light sources 3 in the form of light-emitting diodes. The light sources 3 are arranged centrally on the printed circuit board 1, with a uniform spacing with respect to one another. In addition, a plurality of electronic component parts 4 are arranged on the upper side 2 of the first printed circuit board 1. The electronic component parts 4 can be in the form of SMD components (SMD=Surface-Mounted Devices), which are soldered directly to the printed circuit board 1 by solderable connection areas. The electronic component parts 4 are arranged in the form of a circle around the light sources 3. The first printed circuit board 1 forms a so-called "light engine" with the light sources 3 and the electronic component parts 4.

In addition, the lighting module has a ring-shaped covering element 5, which is formed in the shape of a hood and is positioned on the first printed circuit board 1 so that the outer circumferential surface 6 of the covering element 5 terminates flush with the outer edge 7 of the first printed circuit board 1. The covering element 5 is formed in such a way that it covers the electronic component parts 4 on the first printed circuit board 1, but the covering element 5 does not cover the first printed circuit board 1 in the region of the light sources 3, but rather the covering element 5 has a clearance, which is bounded by an outwardly directed inner circumferential surface 8. Therefore, the covering element 5 covers the first printed circuit board 1 between its circular outer circumferential surface 6 and its circular inner circumferential surface 8, wherein the covering element 5 rests both with its outer circumferential surface 6 and with its inner circumferential surface 8 on the upper side 2 of the first printed circuit board 1.

In addition, the lighting module has a second printed circuit board 9, which is arranged above the first printed circuit board 1, parallel to the first printed circuit board 1. A plurality of electronic components 11 in the form of SMD components are fastened on the upper side 10 of the second printed circuit board 9, which points away from the first printed circuit board 1. In the embodiment shown here, the electronic components 11 are capacitors formed from a ceramic material which, in the case of conventional lighting modules, are in the form of electrolytic capacitors and are arranged in an external driver or external control gear. The electronic components 11 in the form of ceramic capacitors in particular serve the purpose of smoothing supply voltages of the light sources 3, filtering out electromagnetic interference and reducing development of noise.

The second printed circuit board 9, which in this case is in the form of a flexible printed circuit board, is fastened on an inner face 23, which points in the direction of the first printed circuit board 1, of a top wall 13 of the covering element 5, wherein the top wall 13 of the covering element 5 is shaped in such a way that the upper side 10 of the second printed circuit board 9 is arranged spaced apart from the inner surface 25 of the top wall 13 of the covering element 5 in the region of the electronic components 11, with the result that the electronic components 11 arranged on the second printed circuit board 9 are arranged between the second printed circuit board 9 and the inner surface 25 of the top wall 13 of the covering element 5. Therefore, the second printed circuit board 9 is arranged between the electronic component parts 4 arranged on the first printed circuit board 1 and the electronic components 11 arranged on the second printed circuit board 9, with the result that the second printed circuit board 9 forms an insulating layer between the electronic component parts 4 and the electronic components 11.

In order to form an electrical connection between the first printed circuit board 1 and the second printed circuit board 9, a first connection lug 14 is formed on the second printed circuit board 9, which connection lug is bent away downwards from the basic body 15 of the second printed circuit board 9, on which the electronic components 11 are arranged, in an L-shaped manner in the direction of the first printed circuit board 1 and, as a result, at least partially rests on the first printed circuit board 1. The first connection lug 14 can be connected to the first printed circuit board 1 via a welded or soldered connection at the point at which the first connection lug 14 rests on the first printed circuit board 1, as a result of which an electrical connection is formed between the first printed circuit board 1 and the second printed circuit board 9.

FIG. 2 to FIG. 7 show a method for mounting a lighting module as shown in FIG. 1 schematically with the individual production and mounting steps.

Figure 2:
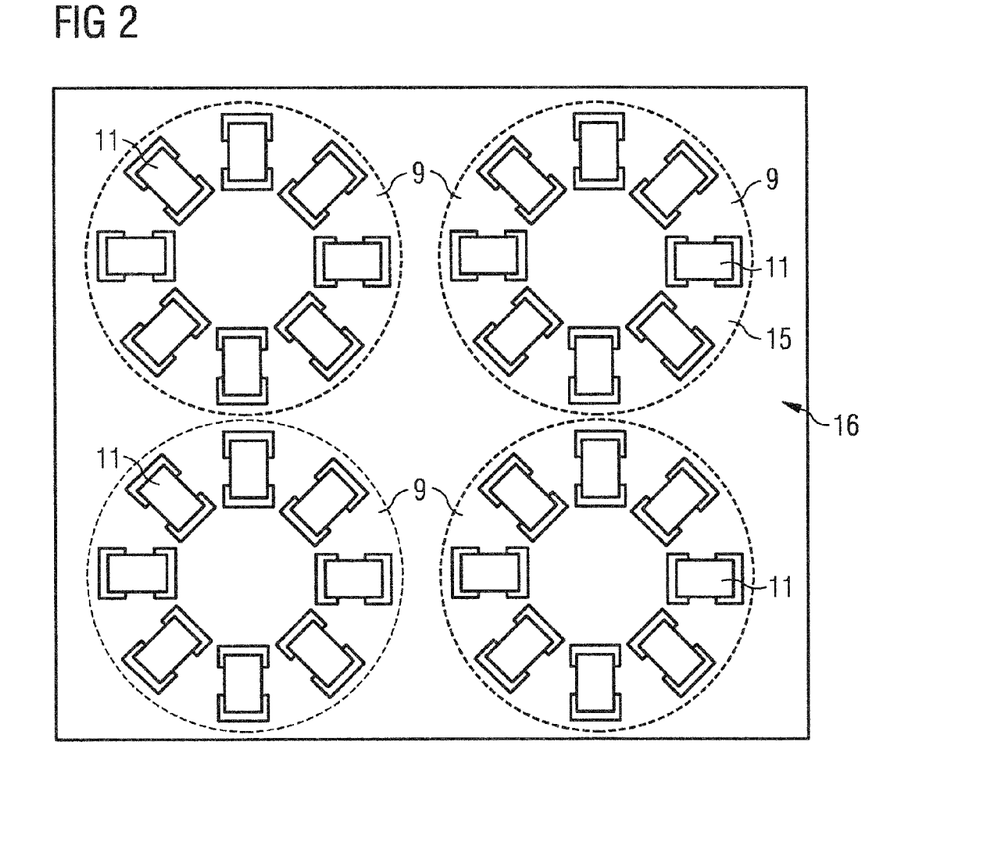
FIG. 2 shows a schematic illustration of a mounting step for forming a lighting module as shown in FIG. 1.

A plurality of second printed circuit boards 9 for producing a plurality of lighting modules can be shaped from a large-area printed circuit board panel 16, as is shown in FIG. 2, wherein, prior to the shaping of the second printed circuit boards 9, for example by punching from the printed circuit board panel 16, the second printed circuit boards 9 are populated with electronic components 11, in this case with in each case eight electronic components 11, for example, by virtue of said components being surface-mounted as SMD components, in the case of which a solderable connection area of the electronic components 11 can be soldered directly to the already prepunched printed circuit boards 9 so as to form a circle, indicated by the circular dashed lines.

Figure 3:
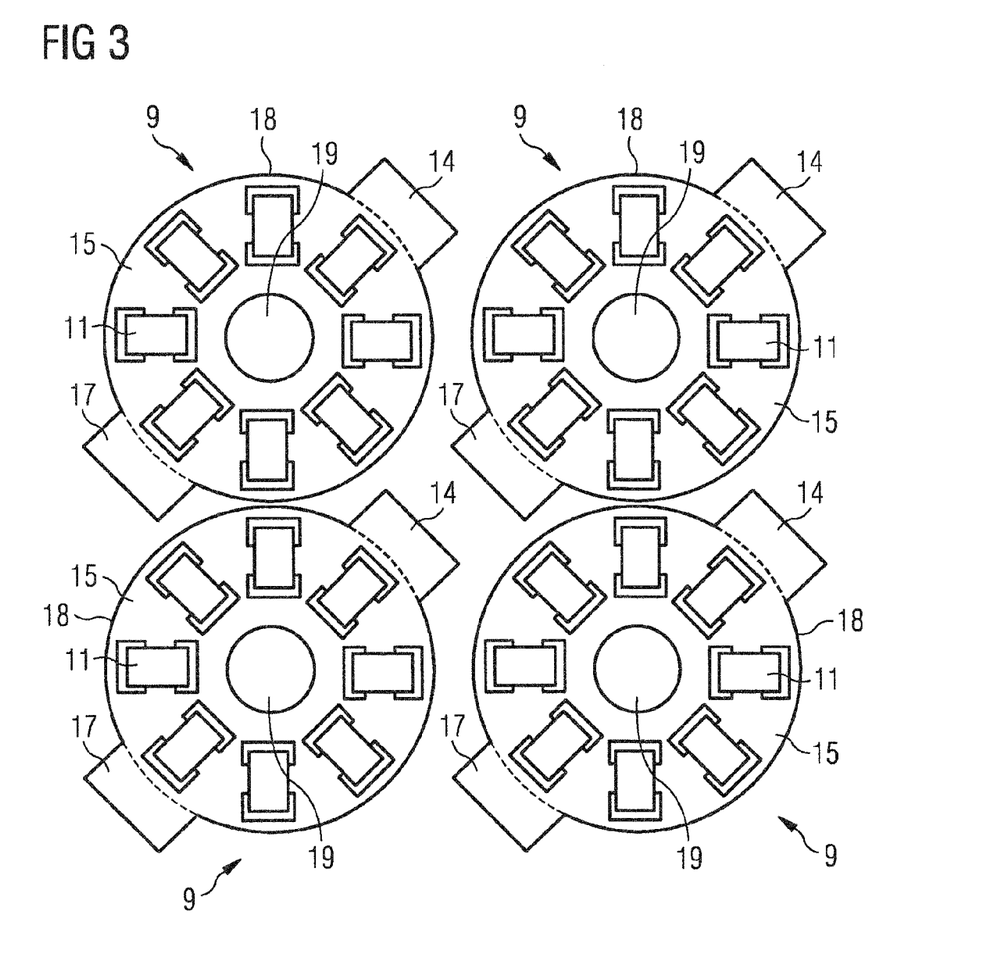
FIG. 3 shows a schematic illustration of a further mounting step for forming a lighting module as shown in FIG. 1.
Figure 4:
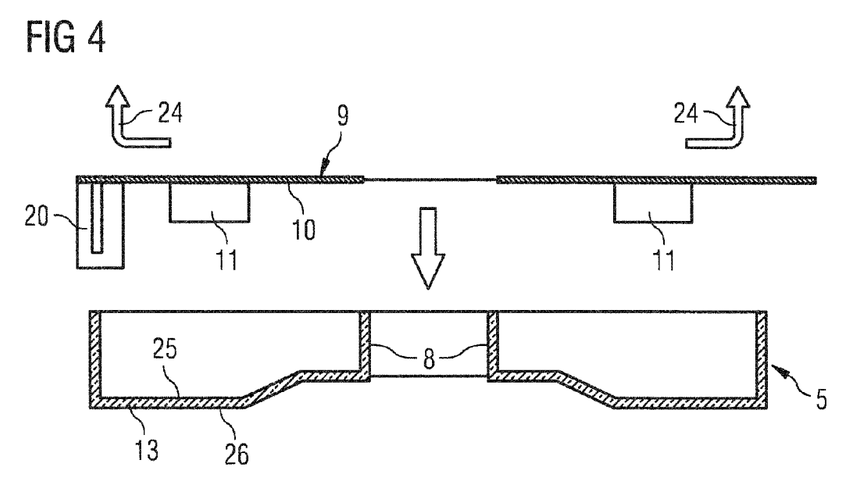
FIG. 4 shows a schematic illustration of a further mounting step for forming a lighting module as shown in FIG. 1.

Then, as shown in FIG. 3, the individual second printed circuit boards 9 are punched out of the printed circuit board panel 16, wherein said second printed circuit boards are punched out in such a way that in each case a first connection lug 14 and a second connection lug 17 is integrally formed on the circular basic body 15 of the printed circuit boards 9, which connection lugs are in this case rectangular. The two connection lugs 14, 17 are integrally formed on the outer circumferential surface of the basic body 15 and are opposite one another. The connection lugs 14, 17 are accordingly formed from the same material as the basic body 15 of the second printed circuit board 9. Owing to the fact that the second printed circuit board 9 is a flexible printed circuit board in this case, the connection lugs 14, 17 can be bent or folded flexibly into the desired shape. A mains connection 20 in the form of a module connector, as is shown in FIG. 4, is mounted on the second connection lug 17, wherein the mains connection 20 is likewise fastened on the second connection lug 17 as SMD component by surface mounting, in which a solderable connection area of the mains connection 20 is soldered directly to the second connection lug 17. As an alternative, it is also possible, for example, to form the module connector as a zero-force connector (zero insertion force connector) and to fasten said module connector on the second connection lug 17.

As can further be seen in FIG. 3, the second printed circuit boards 9 have a through-opening 19 centrally in the basic body 15 of said second printed circuit boards, which through-opening can likewise be formed by punching. The through-opening 19 is formed in the region of the light sources 3 of the printed circuit board 1 so that light emitted from the light sources 3 can pass unimpeded through the second printed circuit board 9 and out of the lighting module. The basic body 15 or the second printed circuit board 9 is therefore in the form of a ring.

FIG. 4 shows the mounting of the second printed circuit board 9 populated with the electronic components 11 in the covering element 5. The second printed circuit board 9 is in this case inserted into the covering element 5, which in this case rests on an outer side 26 of the top wall 13, wherein the two connection lugs 14, 17, as indicated by the arrows 24, are bent upwards, away from the covering element 5.

Figure 5:
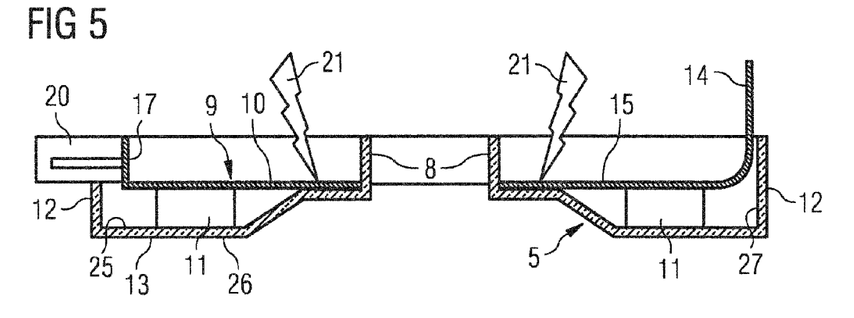
FIG. 5 shows a schematic illustration of a further mounting step for forming a lighting module as shown in FIG. 1.

In FIG. 5, the second printed circuit board 9 is inserted into the covering element 5, wherein the second printed circuit board 9 is fastened with its upper side 10 on an inner surface 25, formed adjacent to the inner circumferential surface 8 of the covering element 5, of the top wall 13 by an adhesive connection, a welded connection or a latch-in connection, as illustrated by the arrows 21. If the printed circuit board 9 is inserted into the covering element 5, the mains connection 20 arranged on the second connection lug 17 rests on a side wall 12 forming the outer circumferential surface 6 of the covering element 5, wherein the side wall 12 is provided with a cutout corresponding to the size of the mains connection 20 in this region. The side wall 12 therefore acts as a type of support in this region, with the result that the plug-in forces acting on the mains connection 20 can be absorbed by the side wall 12. The first connection lug 14 is guided along the side wall 12, in particular the inner surface 27 of the side wall 12, so that the side wall 12 acts as a type of guide here.

Figure 6:
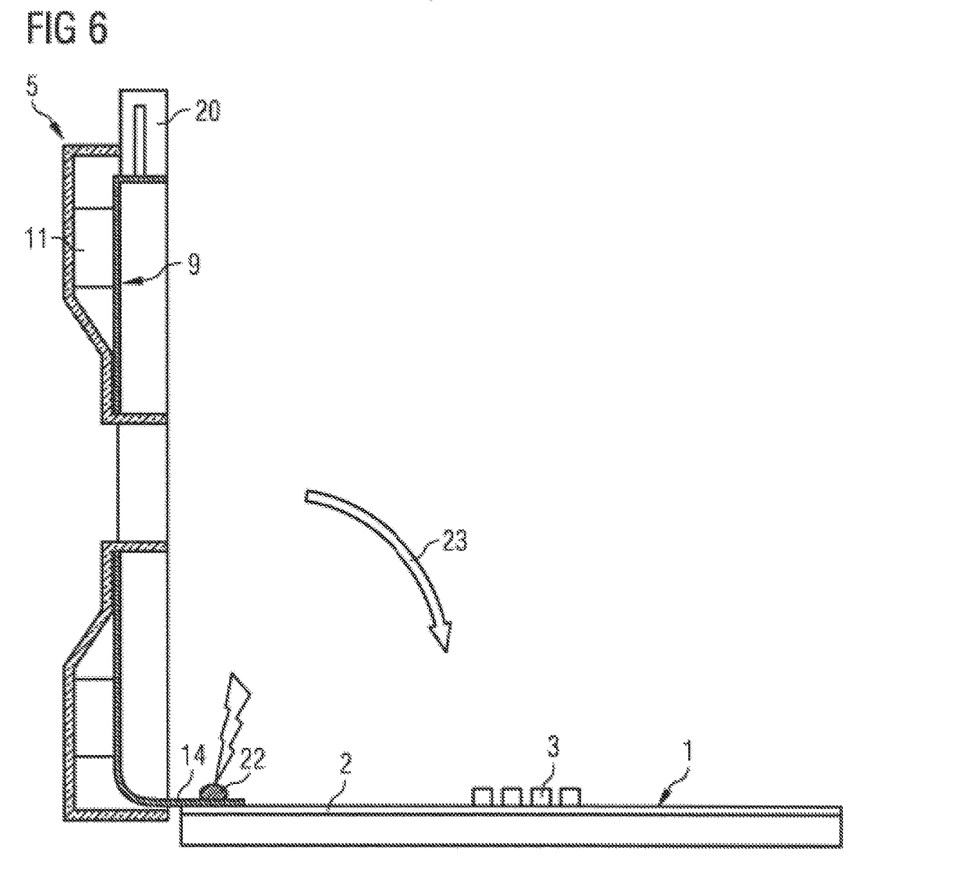
FIG. 6 shows a schematic illustration of a further mounting step for forming a lighting module as shown in FIG. 1.

In a further mounting step, as shown in FIG. 6, the second printed circuit board 9 is fastened together with the covering element 5 on the first printed circuit board 1, on which already a plurality of light sources 3 are arranged, and is electrically connected thereto at the same time. This takes place by virtue of the first connection lug 14 being welded or soldered onto the upper side 2 of the first printed circuit board 1, as is illustrated here by the connection point 22. During the connection, in particular welding or soldering, the second printed circuit board 9 is arranged together with the covering element 5 substantially at a right angle and therefore perpendicular to the first printed circuit board 1, as can be seen from FIG. 6.

Figure 7:
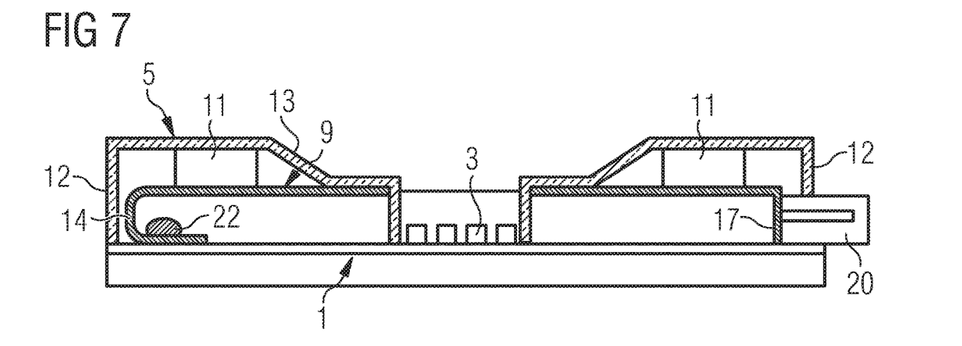
FIG. 7 shows a schematic illustration of a further mounting step for forming a lighting module as shown in FIG. 1.

If the second printed circuit board 9 is connected to the first printed circuit board 1, the second printed circuit board 9 is pivoted together with the covering element 5 downwards, as indicated by the arrow 23, in the direction of the first printed circuit board 1, by virtue of the first connection lug 14 bending, in such a way that, in an end position, as shown in FIG. 7, the second printed circuit board 9 is oriented parallel to the first printed circuit board 1.

Then, the covering element 5 is connected detachably or undetachably to the first printed circuit board 1, for example by a clamping connection, an adhesive connection or a hot-caulking connection, without slip.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A lighting module, comprising:
   a first printed circuit board, on which at least one light source is arranged,
   a covering element, which partially covers the first printed circuit board, leaving a portion thereof exposed, and
   a second printed circuit board, on which at least one electronic component is arranged,
      wherein the second printed circuit board is fastened to the covering element and is directly attached and electrically connected to the first printed circuit board for fixing each other; and
      wherein the covering element is connected fixedly and directly to the first printed circuit board.

2. The lighting module as claimed in claim 1,
   wherein the second printed circuit board has a flexible printed circuit board.

3. The lighting module as claimed in claim 1,
   wherein the second printed circuit board is electrically connected to the first printed circuit board by a welded connection or a soldered connection.

4. The lighting module as claimed in claim 1,
   wherein the second printed circuit board has a first connection lug for electrically connecting the second printed circuit board to the first printed circuit board.

5. The lighting module as claimed in claim 1,
   wherein the second printed circuit board has a second connection lug, on which a mains connection is arranged.

6. The lighting module as claimed in claim 1,
   wherein the at least one electronic component is a surface-mounted component.

7. The lighting module as claimed in claim 1,
   wherein the second printed circuit board is fastened on the covering element by a welded connection, an adhesive connection and/or a latch-in connection.

8. The lighting module as claimed in claim 1,
wherein the electronic component is a capacitor.

9. The lighting module as claimed in claim 8,
wherein the electronic component in the form of a capacitor is formed from a ceramic material.

10. The lighting module as claimed in claim 1,
wherein the covering element is connected directly and detachably to the first printed circuit board.

11. The lighting module as claimed in claim 1,
wherein the light source is a light-emitting diode.

12. A lighting module, comprising:
a first printed circuit board, on which at least one light source is arranged,
a covering element having an inner circumferential surface and an outer circumferential surface, and
a second printed circuit board, on which at least one electronic component is arranged,
   wherein the second printed circuit board is fastened to the covering element and is directly attached and electrically connected to the first printed circuit board for fixing each other; and
   wherein the covering element is connected fixedly and directly to the first printed circuit board by at least one of a form-fitting connection, a force-fitting connection and a cohesive connection.

13. A lighting module, comprising:
a first printed circuit board having first portion and second portion,
a covering element, which covers the first portion of the first printed circuit board, and
a second printed circuit board, on which at least one electronic component is arranged,
wherein the second printed circuit board has a through-opening which is formed in the region of the second portion of the first printed circuit board;
wherein the second printed circuit board is fastened to the covering element and is directly attached and electrically connected to the first printed circuit board for fixing each other; and
wherein at least one light source is arranged on the second portion of the first printed circuit board.

* * * * *